United States Patent [19]

Marsh

[11] Patent Number: 5,260,862
[45] Date of Patent: Nov. 9, 1993

[54] A-C POWER LINE FILTER

[75] Inventor: Richard N. Marsh, Cool, Calif.

[73] Assignee: Constant Velocity Transmission Lines, Inc., Auburn, Calif.

[21] Appl. No.: 665,325

[22] Filed: Mar. 6, 1991

[51] Int. Cl.$^5$ .......................... H02M 1/12; H03H 7/00
[52] U.S. Cl. ....................................... 363/39; 333/174; 333/175; 333/176
[58] Field of Search ................. 363/39; 333/173, 174, 333/175, 176, 168

[56] References Cited

U.S. PATENT DOCUMENTS 2,662,216  12/1953  Klinkhamer ........................ 333/168
4,272,743  6/1981  Evans .................................... 333/176

Primary Examiner—Emanuel T. Voeltz
Attorney, Agent, or Firm—Fliesler, Dubb, Meyer & Lovejoy

[57] ABSTRACT

A filter network adapted to be placed in parallel with a power supply which provides a high impedance to the 60 Hz utility frequency but acts like a short circuit to all higher frequencies. The network comprises a plurality of parallel circuits, each of which comprise a capacitor, an inductor and a resistor in series with a second resistor coupled in parallel with the inductor. Signal levels above 60 Hz in a prototype circuit using seven such parallel circuits with a parallel capacitor coupled thereto shows that above 60 Hz the signal from the power supply is attenuated by 25-30 dB at 1 KHz and that the impedance is substantially resistive beyond 1 KHz.

6 Claims, 4 Drawing Sheets

A-C POWER LINE FILTER

BACKGROUND OF THE INVENTION

1. Field of the Invention

The present invention relates to A-C power supplies for supplying power to audio signal generating and transmission equipment in general and in particular to a method and apparatus for providing a low and stable, i.e. resistive, impedance A-C power source with respect to frequencies above 60 Hz for such equipment.

2. Description of the Prior Art

Certain audio equipment is sensitive to high frequency noise induced fluctuations in the impedance of a conventional 60 Hz power source providing power to the equipment. This sensitivity can adversely affect the quality of the audio signals being propagated in the equipment.

SUMMARY OF THE INVENTION

In view of the foregoing, principal objects of the present invention are a method and apparatus for providing a source of A-C utility power for audio equipment which has a high impedance at and below the normal 60 Hz utility power frequency and a low, preferably negligible, and stable impedance at frequencies above 60 Hz.

In accordance with the above objects there is provided a filter network which is adapted to be coupled in parallel with the A-C utility power source supplying audio equipment for providing the above described impedance levels.

In one embodiment of the present invention, the filter network comprises a plurality of parallel coupled resonant circuits. Each of the resonant circuits has a different resonant frequency above 60 Hz and comprises an inductor coupled in series with a capacitor.

In another embodiment of the present invention a resistance is coupled in series with the inductor and capacitor in each of the resonant circuits for damping oscillatory or ringing behavior of the circuit.

In another embodiment of the present invention a resistance is coupled in parallel with the inductor in each of the resonant circuits for limiting the normal impedance rise due to the inductive impedance of the inductor as a function of an increase in frequency. This will cause the resonant circuit to be resistive at frequencies above resonance.

In still other embodiments of the present invention switches are provided in series with one or more of the resonant circuits for use by operators to selectively change the impedance of the filter networks as desired.
dr

BRIEF DESCRIPTION OF THE DRAWINGS

The above and other objects, features and advantages of the present invention will become apparent from the following detailed description of the accompanying drawings, in which.

DETAILED DESCRIPTION OF THE DRAWINGS

The method and apparatus of the present invention comprises a device that when bridging an A-C power line will make the A-C power line appear to have a very high impedance at the conventional 60 Hz utility frequency and a very low, preferably negligible, impedance to all higher frequencies. As will be further described below, the device is placed across the A-C utility power line and therefore is not in the series path between the utility power and the equipment being powered.

As will be further described below, the device of the present invention comprises multiple series resonant circuits which are placed in parallel across the A-C utility power line wherein each of the series resonant circuits is tuned to a different frequency above 60 Hz.

Figure 1:
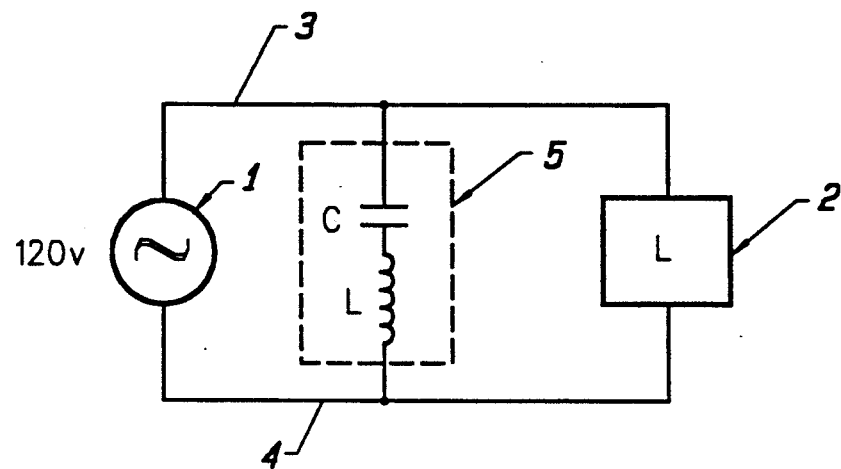
FIG. 1 is a schematic diagram of a single series resonant LC circuit coupled across the output of a source of A-C power.

Referring to FIG. 1, there is shown a 60 Hz, 120 volt source of A-C power 1, coupled to a load 2, such as audio signal generating and transmission apparatus, by means of a first and a second power supply line 3 and 4. Coupled in parallel across the source 1 there is provided an LC network designated generally as 5 comprising a capacitor C and an inductor L coupled in series. The network 5 is tuned to have a resonant frequency $F_R$ above 60 Hz.

Figure 2:
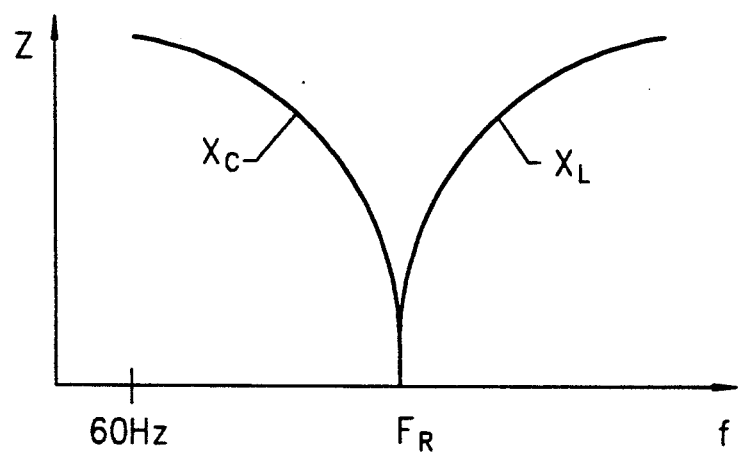
FIG. 2 is a representative plot of impedance v. frequency of a single series LC circuit as shown in FIG. 1.

Referring to FIG. 2, there is shown a representative plot of impedance v. frequency for the circuit of FIG. 1 having a node at the resonant frequency thereof $F_R$ which is located above 60 Hz. As shown in FIG. 2, the impedance of the circuit of FIG. 1 is generally capacitive below the frequency $F_R$ as represented by the curve $X_C$ and inductive above the frequency $F_R$ as shown by the curve $X_L$.

Figure 3:
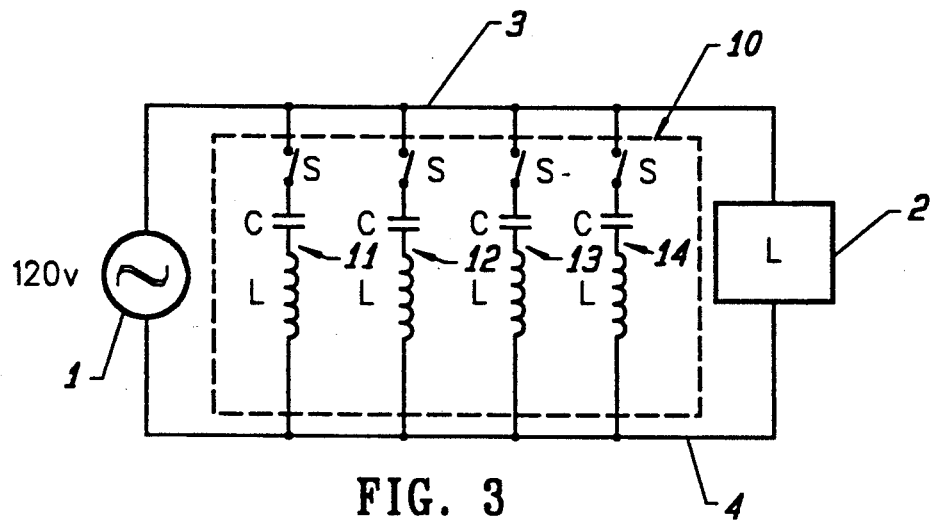
FIG. 3 is a schematic diagram of a plurality of series LC circuits coupled in parallel across the output of a source of A-C power according to the present invention.

Referring to FIG. 3, there is provided in accordance with a first embodiment of the present invention a filter network designated generally as 10. Network 10 comprises a plurality of parallel coupled LC circuits 11, 12, 13, 14. Each of the circuits 11-14 comprises a switch S, a capacitor C and an inductor L coupled in series between the power supply lines 3 and 4. Each of the circuits 11-14 are tuned to a different resonant frequency, $F_1$, $F_2$, $F_3$ and $F_4$, respectively, all of which are above 60 Hz.

Figure 4:
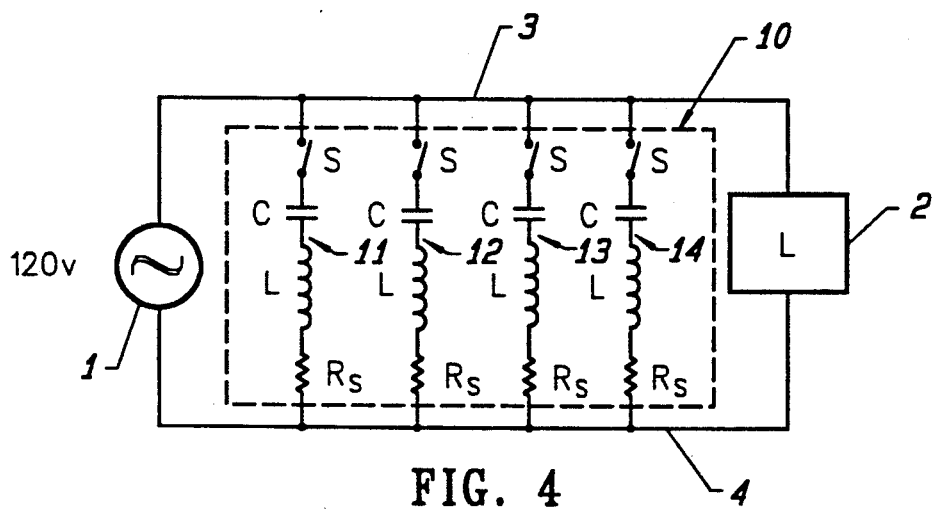
FIG. 4 is a schematic diagram of the circuit of FIG. 3 with a resistor in series with each of the LC circuits.

Referring to FIG. 4, in another embodiment of the present invention a resistance $R_S$ may be used in series with each of the resonant circuits in order to further control the impedance of the individual and combined LC circuits 11-14 of the network 10 of FIG. 3. Such series resistance $R_S$ will change the Q of the circuit (Q=X/R) which controls the amount of oscillatory or ringing behavior of the circuits by damping such behavior.

Figure 5:
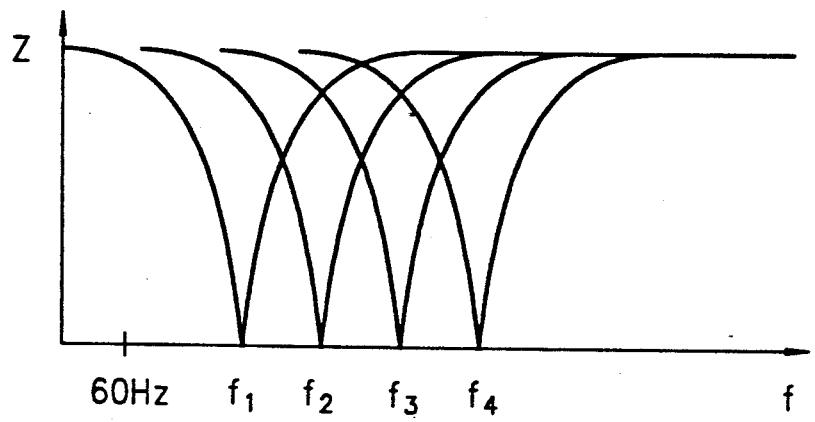
FIG. 5 is a representative plot of impedance v. frequency of the circuits of FIGS. 3 and 4.

Referring to FIG. 5, there is shown a representative plot of impedance v. frequency for each of the resonant circuits in FIGS. 3 and 4. As shown in FIG. 4, a low or zero impedance node exists at each of the frequencies $F_1$-$F_4$.

Figure 6:
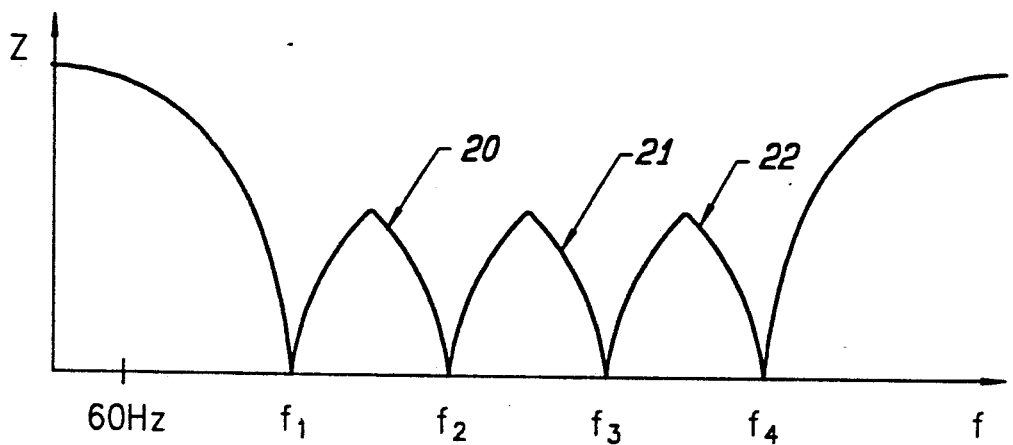
FIG. 6 is a representative plot of the combined resultant of the impedance v. frequency for the circuits of FIGS. 3 and 4.

Referring to FIG. 6, there is shown the combined resultant of the impedance v. frequency curves of FIG. 5. When the impedance curves of FIG. 5 are combined, it can be seen that the impedance of the circuits of FIGS. 3 and 4 is substantially reduced between the frequencies $F_1$ and $F_4$ as shown by the curves 20, 21 and 22.

Figure 7:
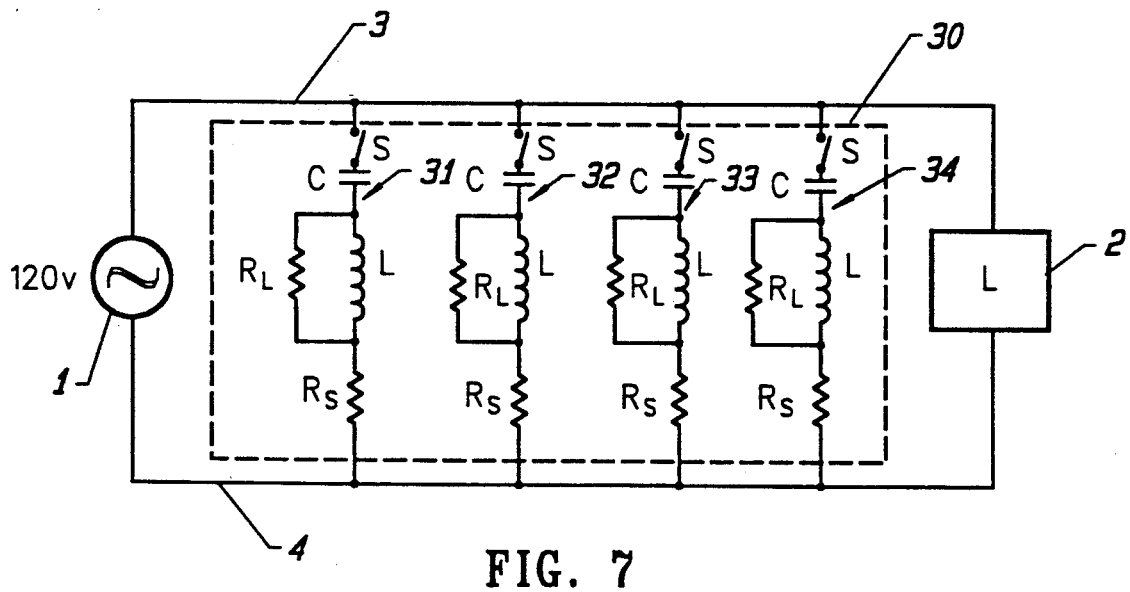
FIG. 7 is a schematic showing a resistance in series with the LC circuits and in parallel with the inductor for dampening oscillations and rendering each of the circuits resistive above their respective resonant frequency.

Referring to FIG. 7, the normal impedance rise due to inductive reactance ($X_L$) can be limited in value by placing a resistor $R_L$ across the inductor. This will cause the impedance to be resistive at frequencies above resonance. Accordingly, there is provided as shown in FIG. 7 a filter network designated generally as 30 comprising a plurality of parallel coupled RLC circuits 31, 32, 33 and 34. In each of the circuits 31-34 there is provided an inductor L, a capacitor C and a resistor $R_S$ coupled in series. Coupled in parallel with the inductor L there is provided a resistor $R_L$.

Figure 8:
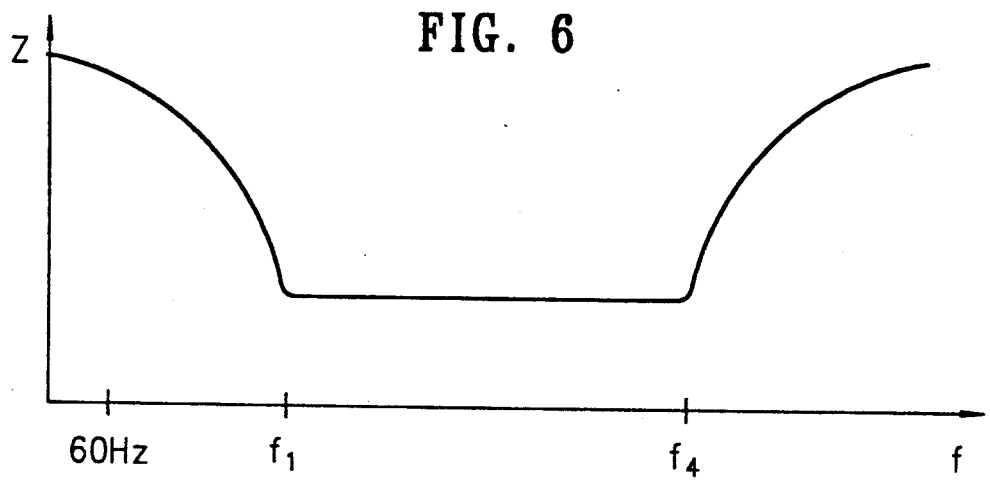
FIG. 8 is a representative plot of impedance v. frequency showing that the impedance of the circuit of FIG. 7 can be made relatively constant, i.e. independent of frequency, and therefore resistive over a wide frequency range.

Referring to FIG. 8, there is shown a representative plot of the impedance v. frequency for the circuit of FIG. 7, wherein the impedance of the circuit between the frequencies $F_1$ and $F_4$ is substantially independent of frequency, i.e. resistive.

Figure 9:
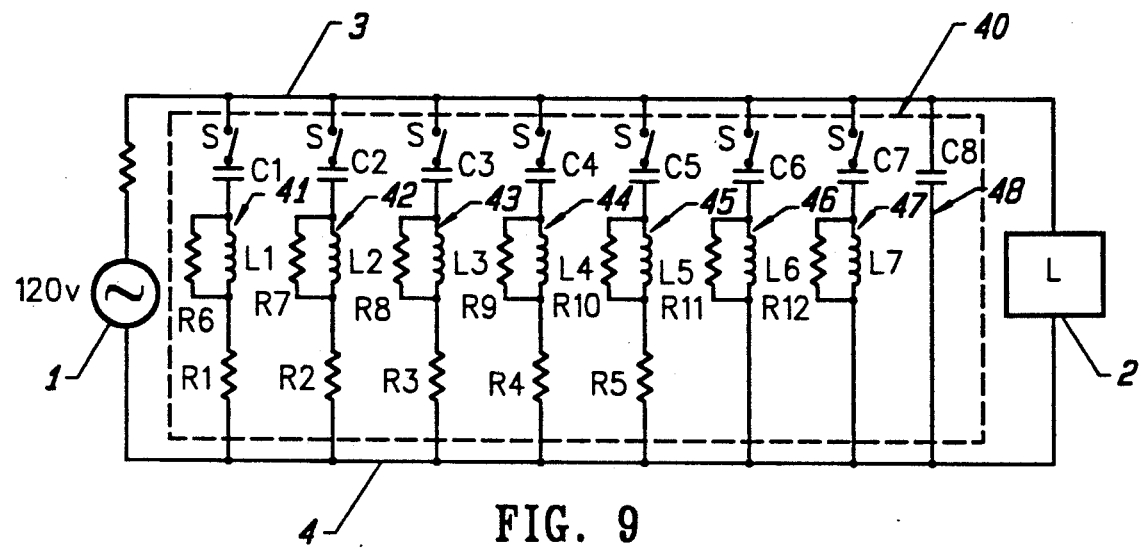
FIG. 9 is a specific embodiment of a filter network according to the present invention.

Referring to FIG. 9, there is shown a specific embodiment of a filter network 40 according to the present invention comprising a plurality of parallel coupled RLC circuits 41, 42, 43, 44, 45, 46 and 47 and a parallel coupled capacitor 48. The circuits 41-47 comprise capacitors C1-C7, respectively. Coupled in series with the capacitors C1-C7 there is provided an inductor L1-L7, respectively. A plurality of resistors R1-R5 are coupled in series with inductors L1-L5, respectively. Coupled in parallel with each of the inductors L1-L7 in the circuits 41-47 there is provided a plurality of resistors R6-R12, respectively. The capacitor 48 is also designated C8. The above-described capacitors, inductors and resistors of FIG. 8 have the following typical values:

C1=18 mf
C2=9 mf
C3=4 mf
C4=2 mf
C5=1 mf
C6=1.5 mf
C7=.22 mf
C8=56 mf
L1-L5=0.5 mh
L6=0.19 mh
L7=0.1 mh
R1-R5=0.1 ohms
R6=24 ohms
R7=24 ohms
R8=20 ohms
R9=20 ohms
R10-R12=20 ohms In each of the embodiments of FIGS. 3-5 and 7 an optional switch S may be provided to enable an operator to selectively remove one or more of the LC circuits from the network as desired.

Figure 10:
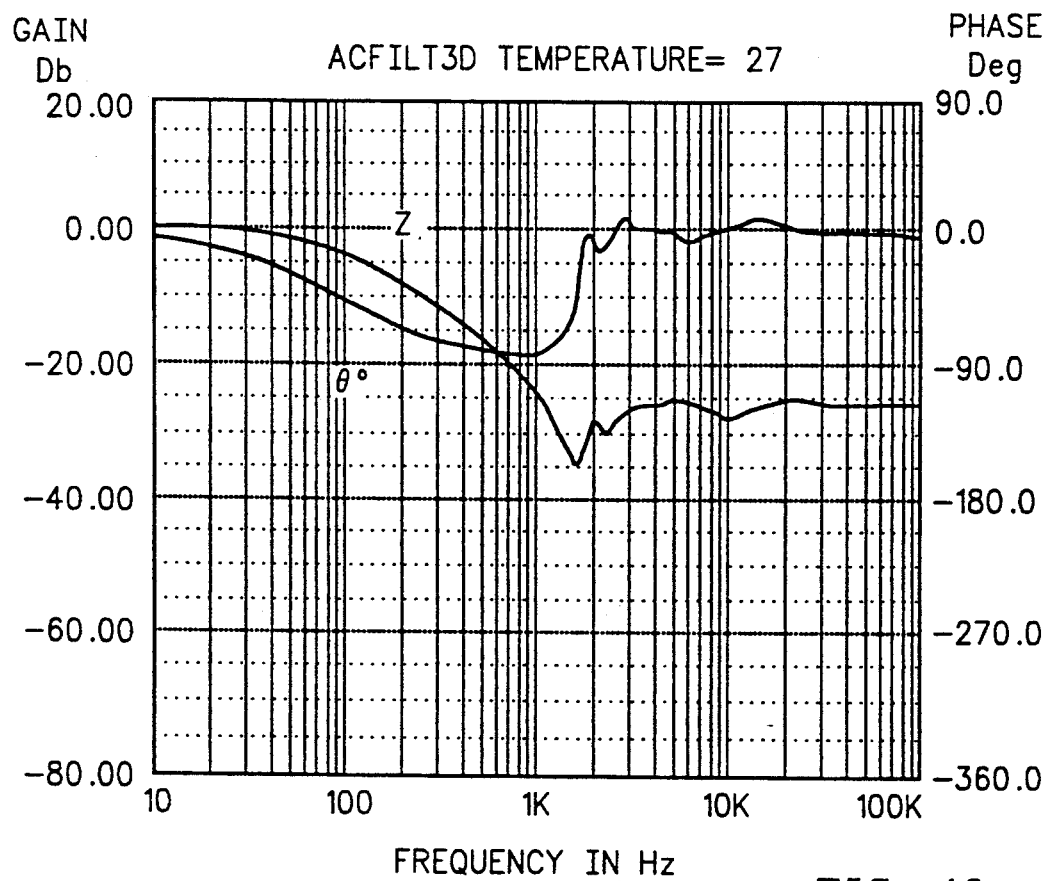
FIG. 10 is a plot of impedance and phase shift for the circuit of FIG. 9.

Referring to FIG. 10, there is shown a plot of gain, i.e. attenuation, and phase shift v. frequency for the circuit of FIG. 9 wherein the load 2 comprises a resistive circuit of approximately 100K ohms. As will be seen from the plot in FIG. 10, the circuit 40 of FIG. 9 attenuates the output power from the source as a function of frequency wherein the attenuation begins just above 60 Hz and reaches a maximum of 25-30 dB at 1 KHz and greater such that the impedance of the power source as seen by the load 2 decreases toward a very low impedance between the supply lines to all frequencies above 60 Hz and is substantially resistive above 1 KHz.

While preferred embodiments of the present invention are described above, it is contemplated that various modifications may be made thereto without departing from the spirit and scope of the present invention. For example, while network 40 is described as comprising seven parallel RLC circuits and a parallel capacitor, there are no theoretical limits to the number of such resonant circuit stages that may be used to extend the low impedance range to cover a wider frequency span than that achieved with the network 40 of FIG. 8. Accordingly, it is intended that the embodiments described be considered only as illustrative of the present invention and that the scope thereof should not be limited thereto but be determined by reference to the claims hereinafter provided and their equivalents.

What is claimed is:

1. An apparatus for coupling a source of 60 Hz A-C power to audio equipment and for providing a low and stable impedance at frequencies above 60 Hz at the power supply input of the audio equipment coupled thereto, said source having a first and a second power supply line, comprising:
   a filter network having a plurality of parallel circuits, each of said circuits comprising a resistor, an inductor and a capacitor coupled in series for providing a plurality of resonant frequency nodes at frequencies above 60 Hz and an absorption of energy at frequencies above 60 Hz; and
   means for coupling each of said circuits in said filter network in parallel with said source between said first and second power supply lines.

2. An apparatus according to claim 1 wherein each of said circuits further comprises a resistor coupled in parallel with said inductor for providing with respect to frequencies above a predetermined frequency a substantially zero degree phase shift between the current and voltage therein.

3. An apparatus according to claim 2 wherein each of said circuits further comprises a switch means coupled in series with selected ones of said series coupled capacitors and inductors.

4. A method of providing a low and stable impedance at frequencies above 60 Hz at the power supply input of audio equipment coupled to a source of 60 Hz A-C power, said source having a first and a second power supply line, comprising the step of:
   coupling a filter network having a plurality of circuits in parallel between said first and second power supply lines, each of said circuits comprising a resistor, an inductor and a capacitor coupled in series for providing a plurality of resonant frequency nodes at frequencies above 60 Hz and an absorption of energy above 60 Hz.

5. A method according to claim 4 wherein said coupling step further comprises the step of coupling a resistor in parallel with said inductor for providing with respect to frequencies above a predetermined frequency a substantially zero degree phase shift between the current and voltage therein.

6. A method according to claim 5 wherein said coupling further comprises the step of coupling a switch means in series with selected ones of said series coupled capacitors and inductors.

* * * * *